United States Patent
Bae et al.

(10) Patent No.: US 10,923,061 B2
(45) Date of Patent: Feb. 16, 2021

(54) GATE DRIVING CIRCUIT WITH REDUCED POWER CONSUMPTION AND DISPLAY DEVICE INCLUDING THE SAME

(71) Applicant: Samsung Display Co., Ltd., Yongin-Si (KR)

(72) Inventors: Hyeonseok Bae, Suwon-si (KR); Haengwon Park, Seongnam-si (KR); Jungdeok Seo, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/393,018

(22) Filed: Apr. 24, 2019

(65) Prior Publication Data

US 2020/0035182 A1    Jan. 30, 2020

(30) Foreign Application Priority Data

Jul. 25, 2018 (KR) .......................... 10-2018-0086510

(51) Int. Cl.
*G09G 3/36* (2006.01)
*G11C 19/28* (2006.01)

(52) U.S. Cl.
CPC .......... *G09G 3/3677* (2013.01); *G11C 19/28* (2013.01); *G09G 2310/027* (2013.01); *G09G 2310/0248* (2013.01); *G09G 2330/021* (2013.01)

(58) Field of Classification Search
None
See application file for complete search history.

(56) References Cited

U.S. PATENT DOCUMENTS

| 8,406,372 B2* | 3/2013 | Hsu | G11C 19/28 377/64 |
| 8,558,601 B2* | 10/2013 | Jang | G09G 3/3677 327/295 |
| 8,731,136 B2* | 5/2014 | Shin | G11C 19/28 377/64 |
| 8,760,381 B2* | 6/2014 | Suzuki | G09G 3/003 345/100 |
| 8,854,292 B2 | 10/2014 | Han et al. | |
| 8,860,651 B2* | 10/2014 | Tseng | G11C 19/28 345/100 |

(Continued)

FOREIGN PATENT DOCUMENTS

| KR | 101520807 B1 | 5/2015 |
| KR | 1020150070635 A | 6/2015 |

(Continued)

*Primary Examiner* — Chad M Dicke
(74) *Attorney, Agent, or Firm* — Cantor Colburn LLP

(57) ABSTRACT

A gate driving circuit includes a charge part which charges a charge node with a clock signal having a first high voltage for a first period, an output part which charges an output node with the first high voltage in response to a first voltage of the charge node for the first period, and outputs a second voltage of the output node as a gate signal, a first discharge part which discharges the second voltage to a first off voltage in response to a clock bar signal having a second high voltage for a second period following the first period, and a second discharge part which discharges the first voltage to the second off voltage for the second period. The second off voltage is set to one of a first level lower than a level of the first off voltage and a second level lower than the first level.

10 Claims, 11 Drawing Sheets

(56) References Cited

U.S. PATENT DOCUMENTS

| | | | |
|---|---|---|---|
| 8,928,573 B2* | 1/2015 | Cao | G09G 3/36 345/100 |
| 9,520,099 B2 | 12/2016 | Lee et al. | |
| 9,646,535 B2* | 5/2017 | Yoon | G09G 3/3233 |
| 10,049,619 B2 | 8/2018 | Choi et al. | |
| 10,109,252 B2* | 10/2018 | Cho | G11C 19/184 |
| 10,109,253 B2* | 10/2018 | Lee | G09G 3/3674 |
| 10,121,429 B2* | 11/2018 | Tanaka | G09G 3/3677 |
| 10,121,439 B2* | 11/2018 | Kim | G09G 3/3677 |
| 10,152,910 B2* | 12/2018 | Yoon | G09G 3/2092 |
| 10,186,198 B2* | 1/2019 | Kim | G09G 3/3258 |
| 10,360,863 B2* | 7/2019 | Hwang | G09G 3/3677 |
| 10,473,958 B2* | 11/2019 | Iwase | G09G 3/3677 |
| 2007/0146289 A1* | 6/2007 | Lee | G11C 19/184 345/100 |
| 2007/0171115 A1* | 7/2007 | Kim | G09G 3/3677 341/155 |
| 2007/0274433 A1* | 11/2007 | Tobita | G09G 3/3677 377/64 |
| 2008/0074379 A1* | 3/2008 | Kim | G09G 3/3677 345/99 |
| 2009/0122951 A1* | 5/2009 | Tobita | G11C 19/184 377/68 |
| 2010/0007635 A1* | 1/2010 | Kwon | G09G 3/3677 345/204 |
| 2010/0067646 A1* | 3/2010 | Liu | G11C 19/28 377/69 |
| 2010/0097368 A1* | 4/2010 | Hwang | G09G 3/3677 345/213 |
| 2011/0148853 A1* | 6/2011 | Ko | G09G 3/3677 345/213 |
| 2012/0139883 A1* | 6/2012 | Lee | G09G 3/3611 345/204 |
| 2013/0010916 A1* | 1/2013 | Jang | G09G 3/3677 377/64 |
| 2013/0141318 A1* | 6/2013 | Kim | G09G 3/36 345/87 |
| 2014/0055436 A1* | 2/2014 | Han | G09G 3/3696 345/211 |
| 2014/0119492 A1* | 5/2014 | Liu | G11C 19/28 377/64 |
| 2014/0320175 A1* | 10/2014 | Li | G09G 3/3674 327/109 |
| 2016/0322015 A1* | 11/2016 | Kim | G09G 3/3677 |
| 2017/0110076 A1* | 4/2017 | Hwang | G09G 3/3677 |
| 2017/0186377 A1* | 6/2017 | Kim | G09G 3/3266 |
| 2017/0193947 A1* | 7/2017 | Kim | G09G 3/3677 |
| 2017/0285375 A1* | 10/2017 | Iwase | G02F 1/133 |
| 2019/0096307 A1* | 3/2019 | Liang | G09G 3/20 |
| 2019/0189234 A1* | 6/2019 | Chen | G11C 19/287 |
| 2019/0311691 A1* | 10/2019 | Feng | G09G 3/3677 |
| 2019/0325838 A1* | 10/2019 | Tagawa | G09G 3/3677 |
| 2019/0340991 A1* | 11/2019 | Hwang | G09G 3/3696 |
| 2019/0371422 A1* | 12/2019 | Wang | G11C 19/28 |
| 2020/0035138 A1* | 1/2020 | Zou | G11C 19/287 |

FOREIGN PATENT DOCUMENTS

| | | |
|---|---|---|
| KR | 1020170044568 A | 4/2017 |
| KR | 1020170065063 A | 6/2017 |
| KR | 101768541 B1 | 8/2017 |
| KR | 1020170097255 A | 8/2017 |

\* cited by examiner

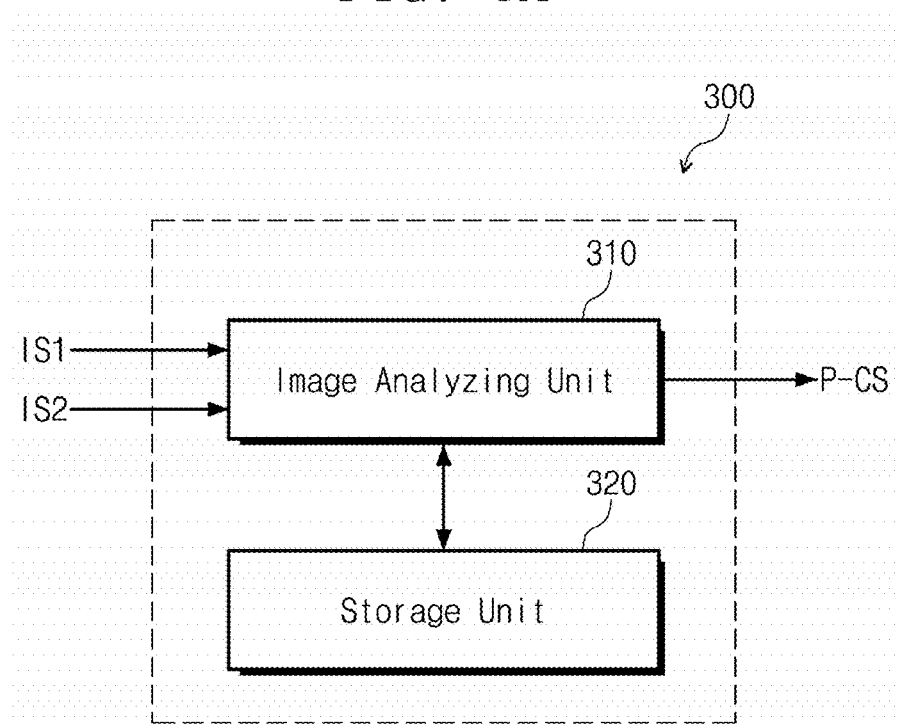

| Power Control Signal (P-CS) | Second Off Voltage (VSS2') |
|---|---|
| PS1 | VL1 |
| PS2 | VL2 |
| PS3 | VL3 |

… (1)

GATE DRIVING CIRCUIT WITH REDUCED POWER CONSUMPTION AND DISPLAY DEVICE INCLUDING THE SAME

This application claims priority to Korean Patent Application No. 10-2018-0086510, filed on Jul. 25, 2018, and all the benefits accruing therefrom under 35 U.S.C. § 119, the content of which in its entirety is herein incorporated by reference.

BACKGROUND

1. Field

The disclosure relates to a display device. More particularly, the disclosure relates to a gate driving circuit integrated in a display panel and a display device including the gate driving circuit.

2. Description of the Related Art

A display device typically includes gate lines, data lines, and pixels connected to the gate lines and the data lines. The display device may include a gate driving circuit for applying gate signals to the gate lines and a data driving circuit for applying data signals to the data lines.

The gate driving circuit typically includes a shift register including driving stage circuits (hereinafter, referred to as "driving stages"). The driving stages output the gate signals to the gate lines, respectively. Each of the driving stages may include transistors to output the gate signal.

SUMMARY

The disclosure provides a gate driving circuit with reduced power consumption.

The disclosure provides a display device including the gate driving circuit.

An embodiment of the invention provides a gate driving circuit including a charge part connected to a charge node, where the discharge part charges the charge node with a clock signal having a first high voltage for a first period, an output part connected to the charge node and an output node, where the output part charges the output node with the first high voltage in response to a first voltage of the charge node for the first period, and outputs a second voltage of the output node as a gate signal, a first discharge part connected to the output node, where the first discharge part discharges the second voltage to a first off voltage in response to a clock bar signal having a second high voltage for a second period following the first period, and a second discharge part connected to the charge node, where the second discharge part discharges the first voltage to a second off voltage for the second period. In such an embodiment, the second off voltage is set to one of a first level and a second level, where the first level is lower than a level of the first off voltage, and the second level is lower than the first level.

In an embodiment, the second off voltage, a first low voltage of the clock signal, and a second low voltage of the clock bar signal may have a same level as each other.

In an embodiment, the clock bar signal may have the second low voltage for the first period, and the clock signal may have the first low voltage for the second period.

In an embodiment, the first discharge part may include a first discharge transistor which discharges the second voltage to the first off voltage in response to the second high voltage of the clock bar signal, and a second discharge transistor which discharges the second voltage to the first off voltage in response to an (i+6)-th carry signal ("i" is a natural number) after the first period.

In an embodiment, an i-th carry signal having the first high voltage of the clock signal may be output from a carry terminal connected between the charge part and the first discharge part for the first period.

In an embodiment, the first discharge part may further include a third discharge transistor which discharges a third voltage of a carry terminal connected between the charge part and the first discharge part to the second off voltage in response to the second high voltage of the clock bar signal for the second period.

In an embodiment, the second discharge part may include a discharge transistor which discharges the first voltage to the second off voltage in response to an (i+10)-th carry signal for the second period.

In an embodiment, a first clock terminal connected to the output part may be electrically connected to a first discharge terminal connected to the first discharge part through the output node.

Another embodiment of the invention provides a gate driving circuit including a charge part connected to a charge node, where the charge part charges the charge node with a clock signal having a first high voltage for a first period, an output part connected to the charge node and an output node, where the output part charges the output node with the first high voltage of the clock signal in response to a first voltage of the charge node for the first period, and outputs a second voltage of the output node as a gate signal, a first discharge part connected to the output node, where the first discharge part discharges the second voltage to a first off voltage in response to a clock bar signal having a second high voltage for a second period following the first period, and a second discharge part connected to the charge node, where the second discharge part discharges the first voltage to a second off voltage for the second period. In such an embodiment, the second off voltage has a same level as the first off voltage.

In an embodiment, the second off voltage, a first low voltage of the clock signal, and a second low voltage of the clock bar signal may have a same level as each other.

Another embodiment of the invention provides a display device including a display panel, a gate driving circuit including a plurality of stages which outputs a plurality of gate signals to the display panel based on a power signal, a power supply circuit which generates the power signal based on a power control signal, and a signal control circuit which outputs the power control signal. In such an embodiment, an i-th stage among the stages includes a charge part which charges a charge node with a clock signal having a first high voltage for a first period, an output part connected to the charge part through the charge node, where the output part charges an output node with the first high voltage of the clock signal in response to a first voltage of the charge node for the first period, and outputs a second voltage of the output node as an i-th gate signal among the gate signals, a first discharge part connected to the output part through the output node, where the first discharge part discharges the second voltage to a first off voltage in response to a clock bar signal having a second high voltage for a second period following the first period, and a second discharge part connected to the charge node, where the second discharge part discharges the first voltage to the second off voltage for the second period. In such an embodiment, the second off voltage has one of a first level and a second level, where the first level is lower than a level of the first off voltage, and the second level is lower than the first level.

In an embodiment, the signal control circuit may include an image analyzing unit which outputs the power control signal based on a grayscale difference between a first grayscale with respect to an image of a first frame and a second grayscale with respect to an image of a second frame following the first frame.

In an embodiment, the image analyzing unit may output the power control signal to set the second off voltage to the second level when the grayscale difference between the first grayscale and the second grayscale is equal to or greater than a first difference.

In an embodiment, the image analyzing unit may output the power control signal to set the second off voltage to the first level when the grayscale difference between the first grayscale and the second grayscale is equal to or smaller than a first difference.

In an embodiment, the power supply circuit may include a power generator which outputs a gate-on voltage, the first off voltage, and the second off voltage having the second level, a power controller which outputs the second off voltage at the first level or at the second level in response to the power control signal, and a clock generator which generates the clock signal and the clock bar signal based on the gate-on voltage and the second off voltage output from the power controller.

In an embodiment, the clock bar signal may have a second low voltage for the first period, the clock signal has a first low voltage for the second period, and the clock generator may set the first low voltage and the second low voltage to have a same level as the second off voltage.

In an embodiment, the power signal may include the clock signal, the clock bar signal, the first off voltage, and the second off voltage.

In an embodiment, the first level may be between the level of the first off voltage and the second level.

In an embodiment, a first clock terminal connected to the output part may be electrically connected to a first discharge terminal connected to the first discharge part through the output node.

In an embodiment, the display panel may include a first substrate on which the gate driving circuit is disposed, a second substrate disposed opposite to the first substrate, and a liquid crystal layer disposed between the first substrate and the second substrate.

According to embodiments of the invention, the overall power consumption of the display device may be reduced.

BRIEF DESCRIPTION OF THE DRAWINGS

The above and other features of the invention will become readily apparent by reference to the following detailed description when considered in conjunction with the accompanying drawings, in which:

FIG. 8A is a block diagram showing a signal control circuit shown in FIG. 7 according to an exemplary embodiment of the disclosure;

FIG. 8B is a table showing an operation of an image analyzing unit shown in FIG. 8A;

DETAILED DESCRIPTION

Figure 1:
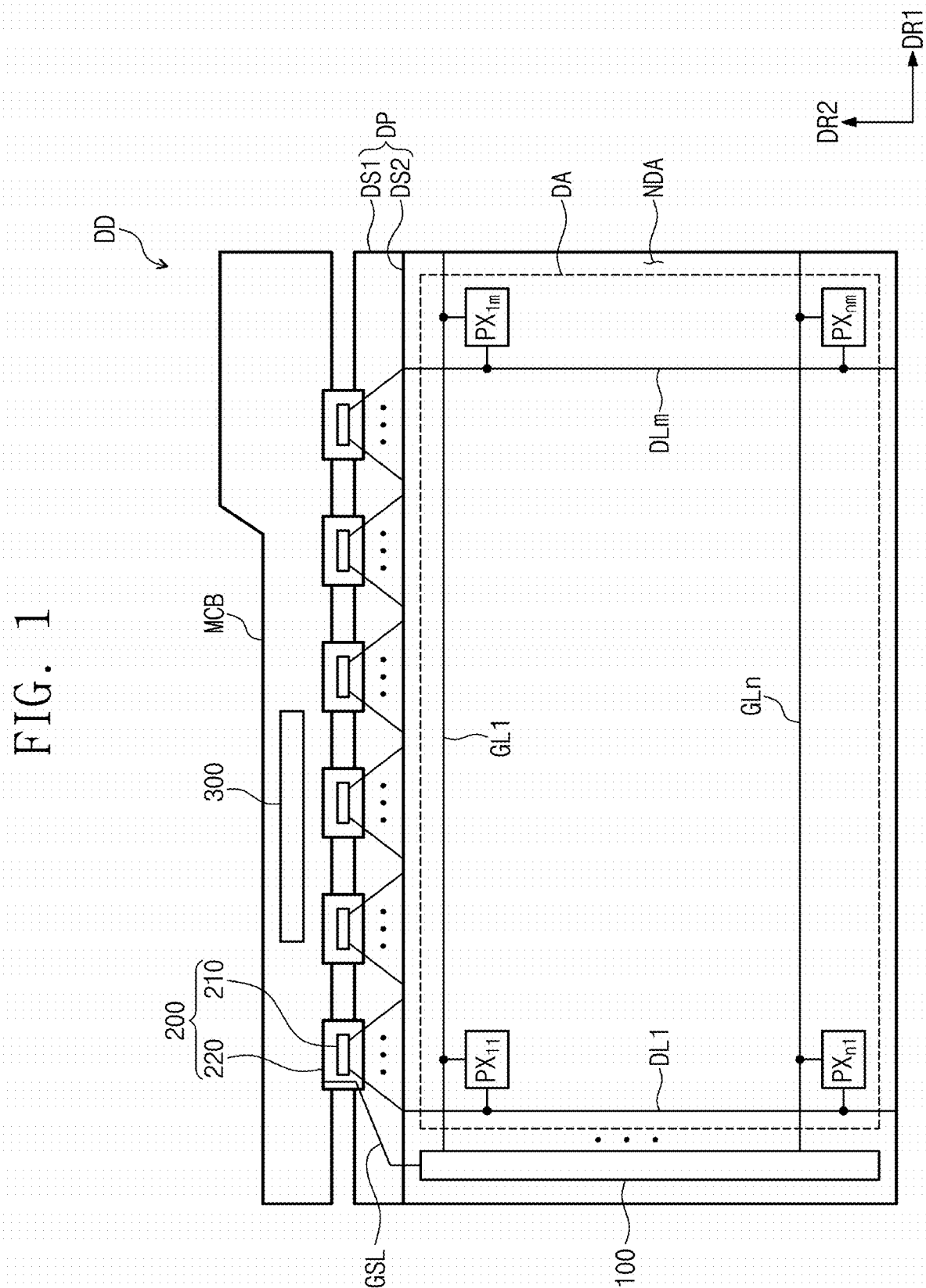
FIG. 1 is a plan view showing a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements present.

"Or" means "and/or." "At least one of A and B" means "A and/or B." As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein. As used herein, the singular forms, "a", "an" and "the" are intended to include the plural forms, including "at least one," unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms comprises" and/or "comprising," or "includes" and/or "including", when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
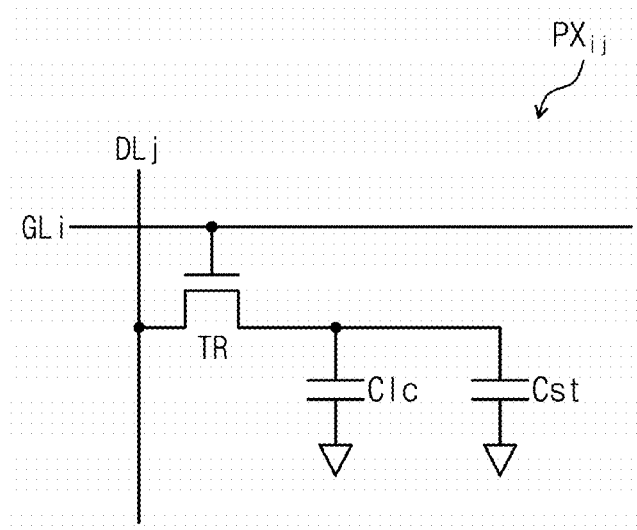
FIG. 2 is an equivalent circuit diagram showing a pixel shown in FIG. 1.
Figure 3:
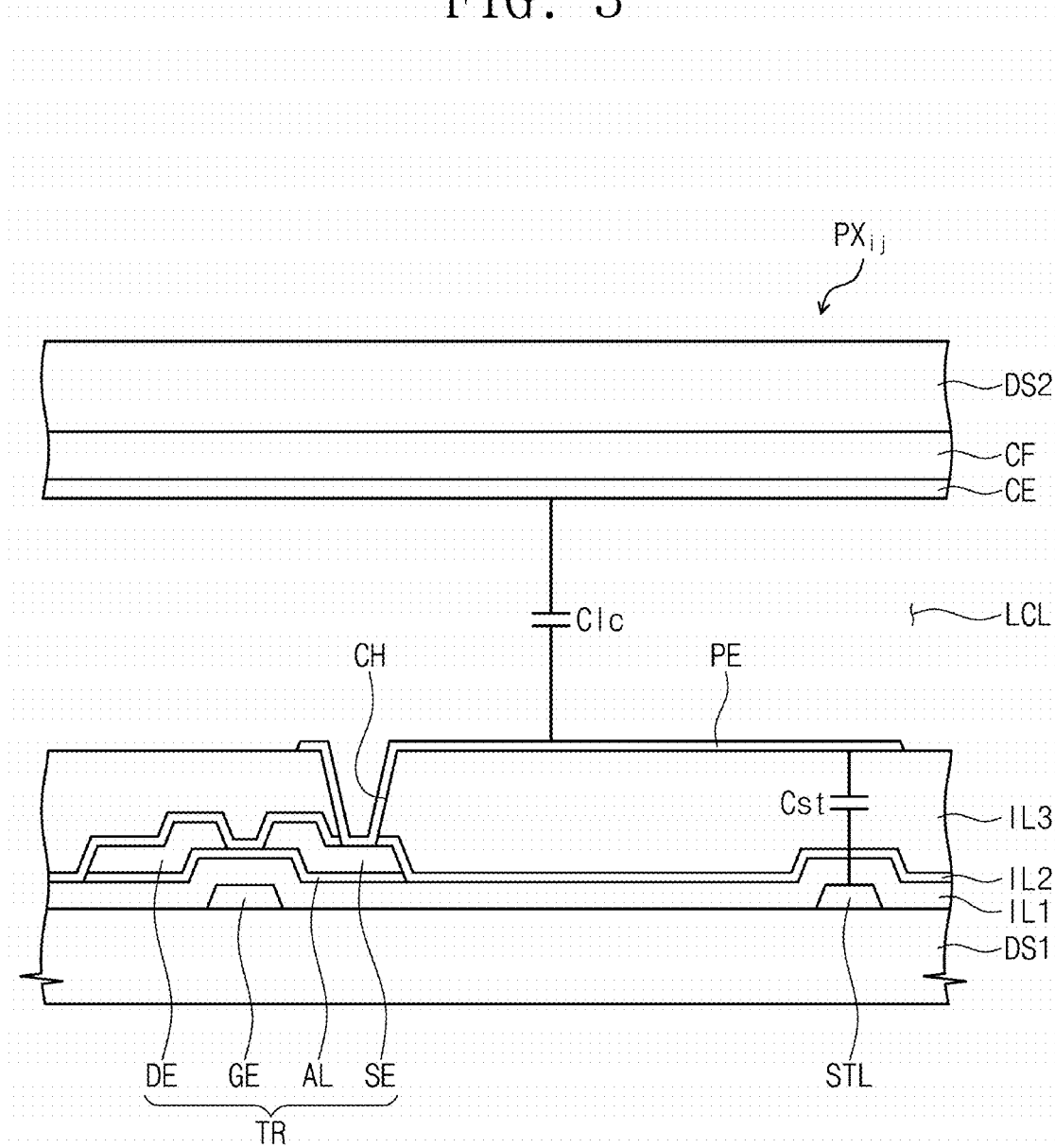
FIG. 3 is a cross-sectional view showing a display device according to an exemplary embodiment of the disclosure.

FIG. 1 is a plan view showing a display device DD according to an exemplary embodiment of the disclosure. FIG. 2 is an equivalent circuit diagram showing a pixel shown in FIG. 1. FIG. 3 is a cross-sectional view showing the display device DD according to an exemplary embodiment of the disclosure.

Referring to FIG. 1, an exemplary embodiment of the display device DD includes a display panel DP, a gate driving circuit 100, a data driving circuit 200, and a signal control circuit 300.

Although not shown in figures, electrical modules mounted on a main board, a camera module, and a power module, may be installed in a bracket or a case with the display device DD to form a mobile phone terminal. An exemplary embodiment of the display device DD may be applied to a large-sized electronic item, such as a television set and a monitor, and a small and medium-sized electronic item, such as a tablet computer, a car navigation, a game unit, and a smart watch.

The display panel DP may include at least one of various display panels, such as a liquid crystal display panel, an organic light emitting display panel, an electrophoretic display panel, and an electrowetting display panel, for example. Hereinafter, for convenience of description, exemplary embodiments where the display panel DP is the liquid crystal display panel will be described in detail. In such embodiments, a liquid crystal display device including the liquid crystal display panel may further include a polarizer, a backlight unit, and the like.

In an exemplary embodiment, the display panel DP includes a first substrate DS1 and a second substrate DS2 facing the first substrate DS1 in a thickness direction of the display panel DP. In such embodiment, the display panel DP includes a display area DA, through which an image is displayed, and a non-display area NDA disposed adjacent to the display area DA. The non-display area NDA may be an area where the image is not visible from the outside of the display panel DP. In an exemplary embodiment, as shown in FIG. 1, the non-display area NDA surrounds the display area DA, but not being limited thereto or thereby. In one alternative exemplary embodiment, for example, the non-display area NDA may be disposed adjacent to a single side of the display area DA.

In an exemplary embodiment, the display panel DP is substantially parallel to a surface defined by a first direction DR1 and a second direction DR2.

The display panel DP includes a plurality of gate lines GL1 to GLn, a plurality of data lines DL1 to DLm, and a plurality of pixels PX11 to PXnm. The gate lines GL1 to GLn extend in the first direction DR1 and are arranged in the second direction DR2. The data lines DL1 to DLm extend in the second direction DR2 and are arranged in the first direction DR1. The data lines DL1 to DLm may be insulated from the gate lines GL1 to GLn while crossing the gate lines GL1 to GLn. The gate lines GL1 to GLn are connected to the gate driving circuit 100, and the data lines DL1 to DLm are connected to the data driving circuit 200.

The pixels PX11 to PXnm are connected to the gate lines GL1 to GLn and the data lines DL1 to DLm. Hereinafter, a circuit configuration of one pixel PXij of the pixels PX11 to PXnm will be described in detail.

Referring to FIG. 2, the pixel PXij includes a pixel thin film transistor TR (hereinafter, referred to as "pixel transistor"), a liquid crystal capacitor Clc, and a storage capacitor Cst. Herein, a term "transistor" means "thin film transistor". In an alternative exemplary embodiment of the disclosure, the storage capacitor Cst may be omitted.

The pixel transistor TR is electrically connected to an i-th gate line GLi and a j-th data line DLj. The pixel transistor TR outputs a pixel voltage corresponding to the data signal provided thereto through the j-th data line DLj in response to the gate signal provided thereto through the i-th gate line GLi.

The liquid crystal capacitor Clc is charged with the pixel voltage output from the pixel transistor TR. An alignment of liquid crystal directors included in a liquid crystal layer LCL is changed depending on an amount of electric charges charged in the liquid crystal capacitor Clc. A component of a light incident into the liquid crystal layer is blocked by the liquid crystal layer or transmits through the liquid crystal layer in accordance with the alignment of the liquid crystal directors.

The storage capacitor Cst is connected to the liquid crystal capacitor Clc in parallel. The storage capacitor Cst maintains the alignment of the liquid crystal directors for a predetermined period.

Referring to FIG. 3, in an exemplary embodiment, the display panel DP further includes a first insulating layer IL1, a second insulating layer IL2, a third insulating layer IL3, a color filter layer CF, a common electrode CE, and the liquid crystal layer LCL in addition to the first substrate DS1 and the second substrate DS2.

The pixel transistor TR described with reference to FIG. 2 includes a control electrode GE connected to the i-th gate line GLi, an active portion AL overlapping the control electrode GE when view from a plan view in a thickness direction of the first substrate DS1, a first electrode DE connected to the j-th data line DLj, and a second electrode SE disposed spaced apart from the first electrode DE.

In an exemplary embodiment, the i-th gate line GLi and a storage line STL are disposed on a surface of the first substrate DS1. The control electrode GE branches from the i-th gate line GLi. The i-th gate line GLi and the storage line STL may include a metal, such as aluminum (Al), silver (Ag), copper (Cu), molybdenum (Mo), chromium (Cr), tantalum (Ta), titanium (Ti), or an alloy thereof. The i-th gate line GLi and the storage line STL may have a multi-layer structure of, for example, a titanium layer and a copper layer.

The first insulating layer IL1 is disposed on the surface of the first substrate DS1 to cover the control electrode GE and the storage line STL. The first insulating layer IL1 may include at least one of an inorganic material and an organic material. The first insulating layer IL1 may be an organic layer or an inorganic layer. The first insulating layer IL1 may have a multi-layer structure of, for example, a silicon nitride layer and a silicon oxide layer.

The active portion AL is disposed on the first insulating layer IL1 to overlap the control electrode GE when view from the plan view in the thickness direction of the first substrate DS1. The active portion AL may include a semiconductor layer and an ohmic contact layer. The semiconductor layer is disposed on the first insulating layer IL1, and the ohmic contact layer is disposed on the semiconductor layer.

The first electrode DE and the second electrode SE are disposed on the active portion AL. The first electrode DE and the second electrode SE are disposed spaced apart from each other. Each of the first electrode DE and the second electrode SE partially overlaps the control electrode GE when view from the plan view in the thickness direction of the first substrate DS1.

The second insulating layer IL2 is disposed on the first insulating layer IL1 to cover the active portion AL, the first electrode DE and the second electrode SE. The second insulating layer IL2 may include at least one of an inorganic material and an organic material. The second insulating layer IL2 may be an organic layer or an inorganic layer. The second insulating layer IL2 may have a multi-layer structure of, for example, a silicon nitride layer and a silicon oxide layer.

FIG. 1 shows an exemplary embodiment where the pixel transistor TR with a staggered structure, but not being limited thereto. In one alternative exemplary embodiment, for example, the pixel transistor TR may have a planar structure.

The third insulating layer IL3 is disposed on the second insulating layer IL2. The third insulating layer IL3 may have a flat surface, e.g., a flat upper surface, to provide a flat surface on layers therebelow. The third insulating layer IL3 may include an organic material.

A pixel electrode PE is disposed on the third insulating layer IL3. The pixel electrode PE is connected to the second electrode SE through a contact hole CH defined through the second insulating layer IL2 and the third insulating layer IL3. An alignment layer (not shown) may be disposed on the third insulating layer IL3 to cover the pixel electrode PE.

The color filter layer CF is disposed on a surface (e.g., a lower surface) of the second substrate DS2. The common electrode CE is disposed on the color filter layer CF. A common voltage is applied to the common electrode CE. The common voltage and the pixel voltage have different values from each other. An alignment layer (not shown) may be disposed on the common electrode CE to cover the common electrode CE. Other insulating layers may be disposed between the color filter layer CF and the common electrode CE.

In an exemplary embodiment, the liquid crystal capacitor Clc is defined by the pixel electrode PE and the common electrode CE along with the liquid crystal layer LCL therebetween. In such an embodiment, portions of the pixel electrode PE and the storage line STL, which are disposed with the first insulating layer IL1, the second insulating layer IL2 and the third insulating layer IL3 therebetween, collectively define the storage capacitor Cst. The storage line STL receives a storage voltage having a value different from that of the pixel voltage. The storage voltage may have a same value as the common voltage.

In an alternative exemplary embodiment, at least one of the color filter layer CF and the common electrode CE may be disposed on the first substrate DS1. In an exemplary embodiment, the liquid crystal display panel may include a vertical alignment ("VA") mode, patterned vertical alignment ("PVA") mode, in-plane switching ("IPS") mode, fringe-field switching ("FFS") mode, or plane-to-line switching ("PLS") mode pixel.

Referring back to FIG. 1, the signal control circuit 300 may be disposed, e.g., mounted, on a main circuit board MCB. The signal control circuit 300 receives image data and control signal from an external graphic controller (not shown). The signal control circuit 300 applies a gate control signal and a data control signal to the gate driving circuit 100 and the data driving circuit 200, respectively, in response to the control signals.

In one exemplary embodiment, for example, the control signal may include a vertical synchronization signal to distinct frames adjacent to each other, a horizontal synchronization signal as a row distinction signal to distinct horizontal periods, a data enable signal maintained at a high level during a predetermined period, in which data are output, to indicate a data input period, and clock signals.

The gate driving circuit 100 generates the gate signals based on the gate control signal provided from the signal control circuit 300 through a signal line GSL. The gate control signal may include a vertical start signal that starts an operation of the gate driving circuit 100. The gate driving circuit 100 applies the gate signals to the gate lines, respectively. The gate signals may be sequentially output corresponding to each horizontal period.

According to an exemplary embodiment, the gate driving circuit 100 may be substantially simultaneously formed with the pixels PX11 to PXnm through a thin film process. In one exemplary embodiment, for example, the gate driving circuit 100 may be mounted on the first substrate DS1 in an amorphous silicon TFT gate ("ASG") driver circuit form to overlap the non-display area NDA when view from a plan view in a thickness direction of the display panel DP. In one alternative exemplary embodiment, for example, the gate driving circuit 100 may be mounted on the first substrate DS1 in an oxide semiconductor TFT gate ("OSG") driver circuit form to overlap the non-display area NDA when view from the plan view in the thickness direction of the display panel DP.

In an alternative exemplary embodiment, the display device DD may include two gate driving circuits. In such an embodiment, among the two gate driving circuits, one gate driving circuit may be connected to left ends of the gate lines GL1 to GLn, and the other gate driving circuit may be connected to right ends of the gate lines GL1 to GLn. In such an embodiment, among the two gate driving circuits, one gate driving circuit may be connected to odd-numbered gate lines, and the other gate driving circuit may be connected to even-numbered gate lines.

The data driving circuit 200 receives the data control signal and image signals from the signal control circuit 300. The data driving circuit 200 converts the image signals to a plurality of data voltages in response to the data control signal and applies the data voltages to the data lines DL1 to DLm. In one exemplary embodiment, for example, the data control signal may include a horizontal start signal that starts an operation of the data driving circuit 200, an inversion signal that inverts a polarity of the data voltages, and an output indicating signal that determines an output timing of the data voltages from the data driving circuit 200.

The data driving circuit 200 may include a driving chip 210 and a flexible printed circuit board 220 on which the driving chip 210 is mounted. The data driving circuit 200 may include a plurality of driving chips 210 and the flexible printed circuit board 220. The flexible printed circuit board 220 electrically connects the main circuit board MCB and the first substrate DS1. The driving chips 210 apply the data signals to corresponding data lines among the data lines DL1 to DLm.

FIG. 1 shows an exemplary embodiment including a tape carrier package type data driving circuit 200. According to an alternative exemplary embodiment, the data driving circuit 200 may be disposed on the non-display area NDA of the first substrate DS1 in a chip-on-glass ("COG") method.

Figure 4:
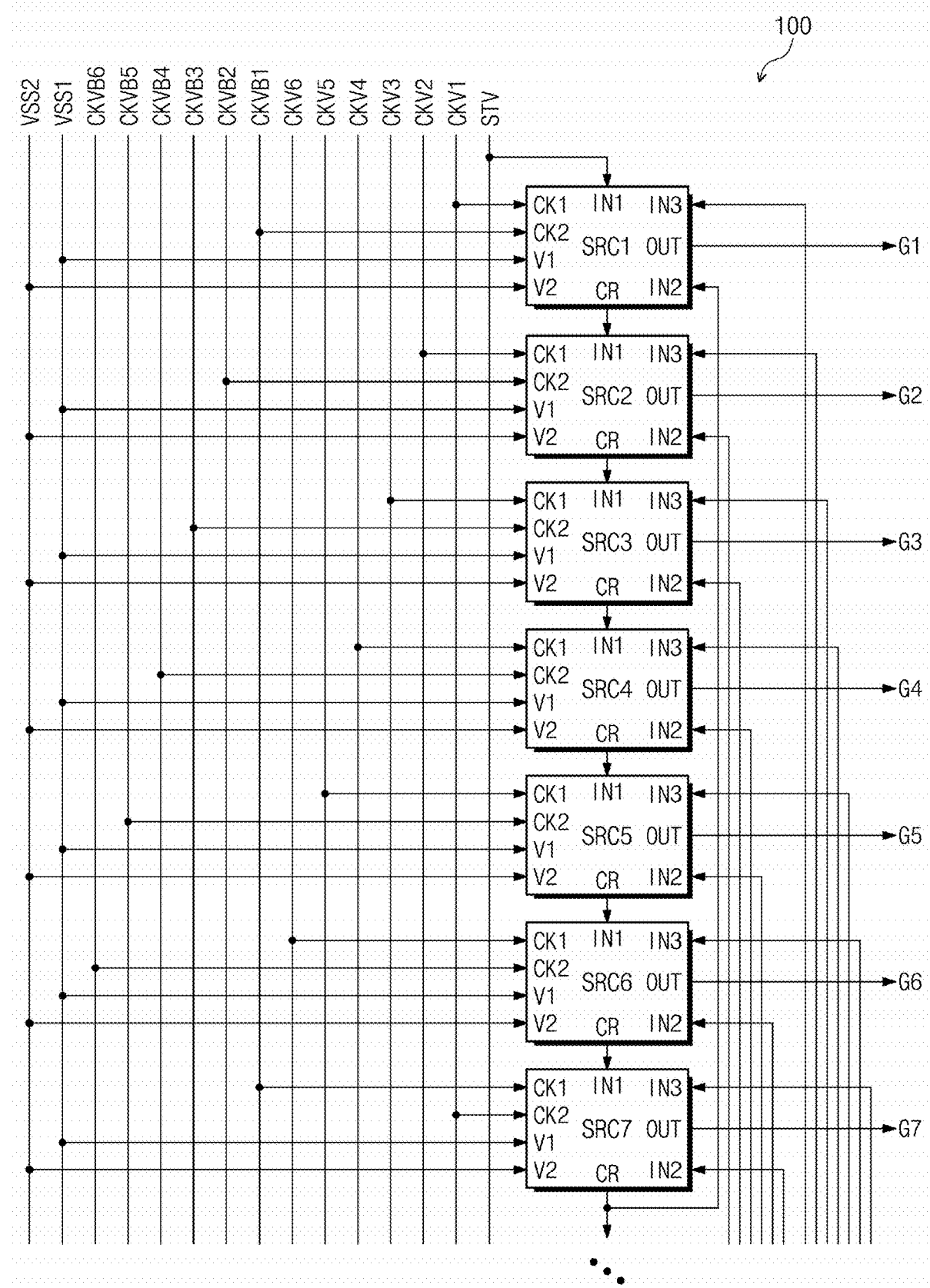
FIG. 4 is a block diagram showing a gate driving circuit according to an exemplary embodiment of the disclosure.
Figure 5:
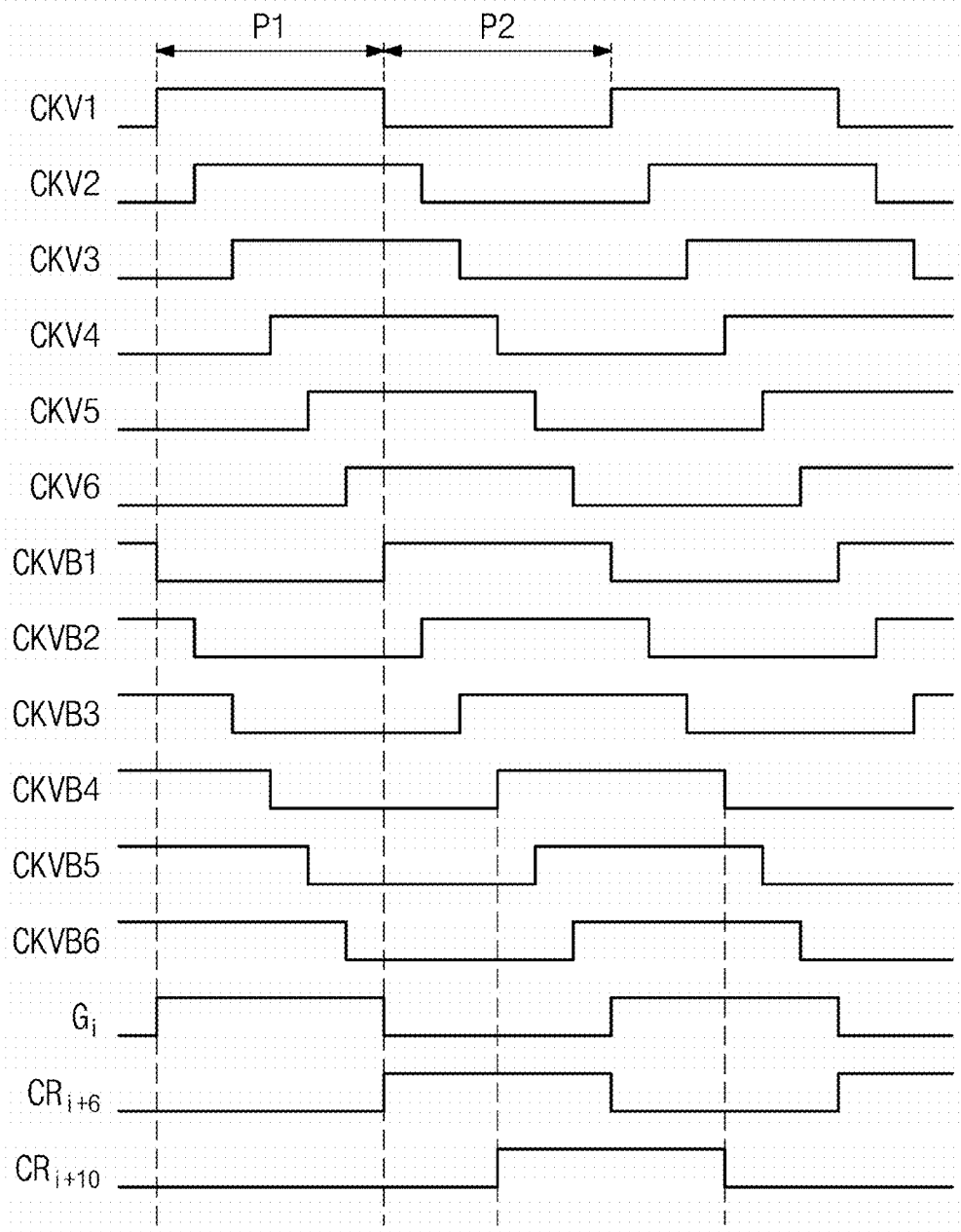
FIG. 5 is a timing diagram showing an operation of stages shown in FIG. 4.

FIG. 4 is a block diagram showing the gate driving circuit 100 according to an exemplary embodiment of the disclosure. FIG. 5 is a timing diagram showing an operation of stages shown in FIG. 4.

Referring to FIG. 4, an exemplary embodiment of the gate driving circuit 100 may include a plurality of stages connected to each other one after another. In such an embodiment, the stages may be cascadely connected stages. The stages form one shift register. The stages may include driving stages that output the gate signals and dummy stages. The driving stages may be connected to gate lines GL1 to GLn, respectively, such that the driving stages apply the gate signals to the gate lines GL1 to GLn, respectively.

For the convenience of illustration and description, FIG. 4 shows first to seventh stages SRC1 to SRC7 corresponding to driving stages among the stages. The first to seventh stages SRC1 to SRC7 are shown as a representative example, and other driving stages and dummy stages, which are not shown, may have the same structure and function as those of the first to seventh stages SRC1 to SRC7.

Each of the first to seventh stages SRC1 to SRC7 (hereinafter, referred to as "stages") includes a first input terminal IN1, a second input terminal IN2, a third input terminal IN3, a first clock terminal CK1, a second clock terminal CK2, a first discharge terminal V1, a second discharge terminal V2, an output terminal OUT, and a carry terminal CR.

In an exemplary embodiment, as shown in FIG. 4, the carry terminal CR of each of the stages SRC1 to SRC7 is electrically connected to the first input terminal IN1 of a next stage. An i-th stage may output an i-th carry signal through the carry terminal CR. Herein, the "i" is a natural number. The first input terminal IN1 of the first stage SRC1 receives the vertical start signal STV that starts the operation of the gate driving circuit 100 instead of receiving a carry signal of a previous stage. The first input terminal IN1 of each of the stages SRC2 to SRC7 after the first stage SRC1 receives the carry signal of the previous stage. The first input terminal IN1 of the i-th stage is electrically connected to a carry terminal CR of an (i−1)-th stage. The input terminals IN1 of the second and third stages SRC2 and SRC3 receive the carry signals of the first and second stages SRC1 and SRC2, respectively.

However, exemplary embodiments are not limited thereto. In such embodiments, the first input terminal IN1 of the i-th stage may be electrically connected to the carry terminal of another previous stage, e.g., (i−2)-th or (i−3)-th stage.

In an exemplary embodiment, as shown in FIG. 4, the second input terminal IN2 of the i-th stage is electrically connected to a carry terminal CR of an (i+6)-th stage to receive a carry signal of the (i+6)-th stage. In one exemplary embodiment, for example, the second input terminal IN2 of the first stage SRC1 receives a carry signal of the seventh stage SRC7, and the second input terminal IN2 of the second stage SRC2 receives a carry signal of an eighth stage.

In an exemplary embodiment, the third input terminal IN3 of the i-th stage is electrically connected to a carry terminal CR of an (i+10)-th stage to receive a carry signal of the (i+10)-th stage. Although not shown in figures, the third input terminal IN3 of the first stage SRC1 receives a carry signal of a eleventh stage, and the third input terminal IN3 of the second stage SRC2 receives a carry signal of an twelfth stage.

In an exemplary embodiment, at least one driving stage among the stages may receive the carry signal through the dummy stages. In such an embodiment, the second input terminal IN2 and the third input terminal IN3 of at least one driving stage may receive the carry signal output from the dummy stages. The dummy stages may be sequentially connected to the last driving stage among the driving stages. However, the position and number of the dummy stages may be variously modified.

In an exemplary embodiment, the first clock terminal CK1 and the second clock terminal CK2 of the i-th stage may receive signals whose phases are inverted from each other, respectively. In such an embodiment, the first clock terminal CK1 of the first stage SRC1 receives the clock signal at a high voltage, and the second clock terminal CK2 of the first stage SRC1 receives a clock bar signal at a low voltage.

Herein, a first period P1 (shown in FIG. 5) may be described as a period during which clock signals CKV1 to CKV6 are at the high voltage, and a second period P2 (shown in FIG. 5) may be described as a period during which the clock signals CKV1 to CKV6 are at the low voltage. Alternatively, the first period P1 may be described as a period during which clock bar signals CKVB1 to CKVB6 are at the low voltage, and the second period P2 may be described as a period during which the clock bar signals CKVB1 to CKVB6 are at the high voltage.

According to exemplary embodiments of the disclosure, the first to sixth stages SRC1 to SRC6 may output first to sixth gate signals G1 to G6 in response to the first to sixth clock signals CKV1 to CKV6. Then, the seventh to twelfth stages may output seventh to twelfth gate signals in response to the first to sixth clock bar signals CKVB1 to CKVB6. The operations of the first to twelfth stages may be repeated.

First, the operation of the first to sixth stages SRC1 to SRC6 will be described.

During the first period P1, a first high voltage of the first clock signal CKV1 is applied to the first clock terminal CK1 of the first stage SRC1, and a second low voltage of the first clock bar signal CKVB1 is applied to the second clock terminal CK2 of the first stage SRC1. The output terminal OUT of the first stage SRC1 may output the first gate signal G1 in response to the first high voltage of the first clock signal CKV1 during the first period P1. A phase difference between the first clock signal CKV1 and the first clock bar signal CKVB1 may be about 180 degrees.

During the first period P1, a first high voltage of the second clock signal CKV2 is applied to the first clock terminal CK1 of the second stage SRC2, and a second low voltage of the second clock bar signal CKVB2 is applied to the second clock terminal CK2 of the second stage SRC2.

The output terminal OUT of the second stage SRC2 may output a second gate signal G2 in response to the first high voltage of the second clock signal CKV2 during the first period P1. A phase difference between the second clock signal CKV2 and the second clock bar signal CKVB2 may be about 180 degrees.

During the first period P1, a first high voltage of the third clock signal CKV3 is applied to the first clock terminal CK1 of the third stage SRC3, and a second low voltage of the third clock bar signal CKVB3 is applied to the second clock terminal CK2 of the third stage SRC3. The output terminal OUT of the third stage SRC3 may output a third gate signal G3 in response to the first high voltage of the third clock signal CKV3 during the first period P1. A phase difference between the third clock signal CKV3 and the third clock bar signal CKVB3 may be about 180 degrees.

In such an embodiment, the fourth to sixth stages SRC4 to SRC6 may respectively output fourth to sixth gate signals G4 to G6 in response to a first high voltage of the fourth to sixth clock signals CKV4 to CKV6 during the first period P1, similarly to the first to fourth stages SRC1 to SRC3.

In an exemplary embodiment according to the disclosure, first high voltage periods of the first to sixth clock signals CKV1 to CKV6 may overlap each other. In one exemplary embodiment, for example, the first high voltage period of the sixth clock signal CKV6 may overlap the first high voltage periods of the first to fifth clock signals CKV1 to CKV5. In such an embodiment, second low voltage periods of the first to sixth clock bar signals CKVB1 to CKVB6 may overlap each other. In such an embodiment, the second low voltage period of the sixth clock bar signal CKVB6 may overlap the second low voltage periods of the first to fifth clock bar signals CKVB1 to CKVB5.

Hereinafter, the operation of the seventh to twelfth stages will be described. The seventh to twelfth stages may respectively output seventh to twelfth gate signals in response to the second high voltage of the first to sixth clock bar signals CKVB1 to CKVB6 during the second period P2.

In an exemplary embodiment, during the second period P2, a second high voltage of the first clock bar signal CKVB1 is applied to the first clock terminal CK1 of the seventh stage SRC7, and a first low voltage of the first clock signal CKV1 is applied to the second clock terminal CK2 of the seventh stage SRC7. The output terminal OUT of the seventh stage SRC7 may output a seventh gate signal G7 in response to the second high voltage of the first clock bar signal CKVB1 during the second period P2.

In an exemplary embodiment, the carry signal output from a carry terminal of the seventh stage SRC7 may be applied to the second input terminal IN2 of the first stage SRC1. In such an embodiment, although not shown in figures, the carry signal of the tenth stage may be applied to the third input terminal IN3 of the first stage SRC1.

In such an embodiment, a first off voltage VSS1 is applied to the first discharge terminal V1 of each of the stages SRC1 to SRC7, and a second off voltage VSS2 is applied to the second discharge terminal V2 of each of the stages SRC1 to SRC7. The first off voltage VSS1 and the second off voltage VSS2 may be a ground voltage.

The first off voltage VSS1 may be higher than the second off voltage VSS2. The first off voltage VSS1 may be in a range from about −10 volts to about −5 volts, and the second off voltage VSS2 may be in a range from about −16 volts to about −10 volts.

According to an alternative exemplary embodiment of the disclosure, a level of the second off voltage VSS2 may be controlled by a grayscale of the image displayed through the display device DD. In one exemplary embodiment, for example, the level of the second off voltage VSS2 may be determined based on a difference in grayscale between the images of two frames adjacent to each other. This will be described later in greater detail.

Figure 6:
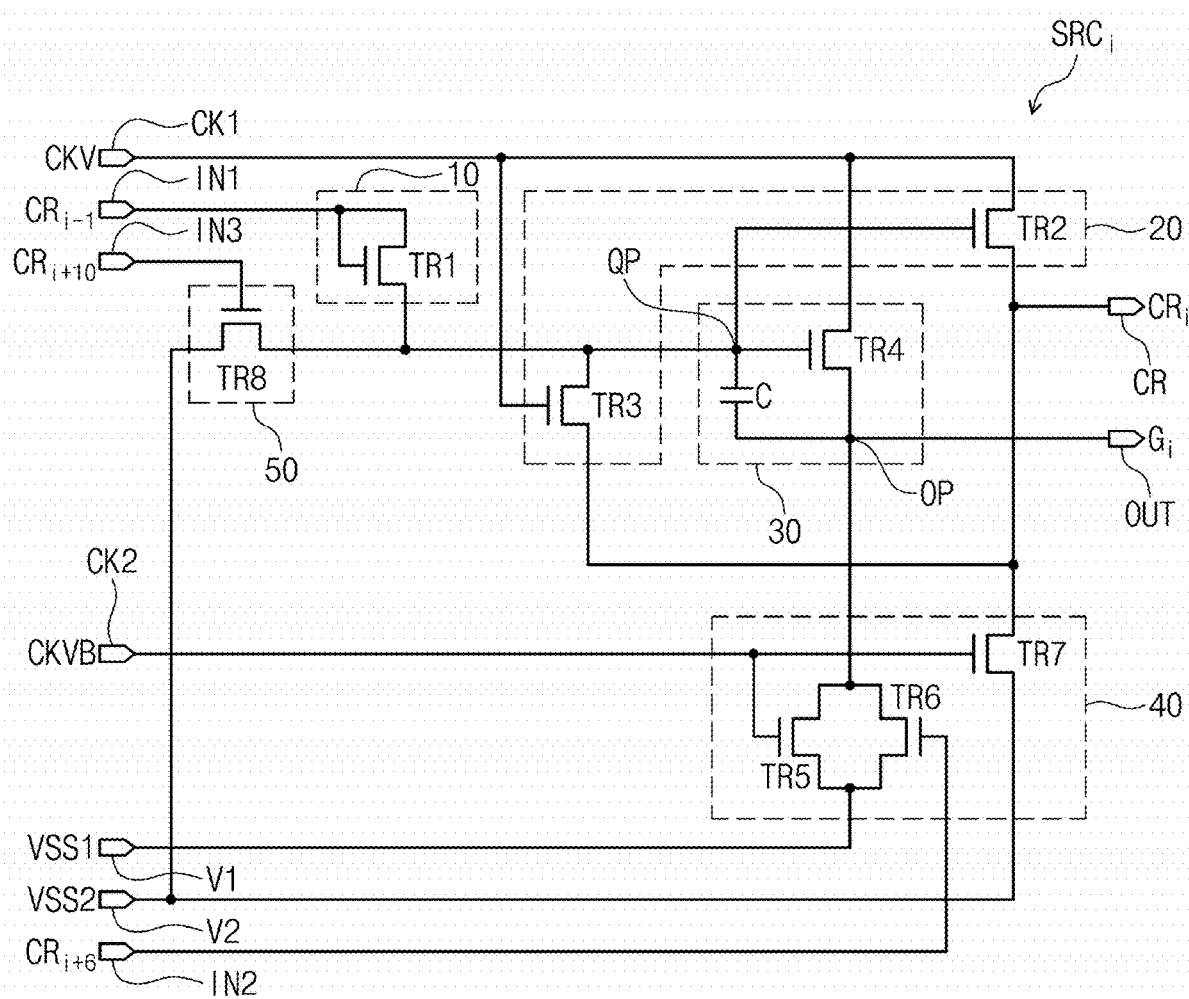
FIG. 6 is a circuit diagram showing a driving stage according to an exemplary embodiment of the disclosure.

FIG. 6 is a circuit diagram showing a stage SRCi according to an exemplary embodiment of the disclosure.

An i-th stage SRCi will be described with reference to FIG. 6 as one of the stages according to the disclosure.

Referring to FIG. 6, the i-th stage SRCi includes a precharge part 10, a charge part 20, an output part 30, a first discharge part 40, and a second discharge part 50.

The precharge part 10 may increase a voltage level of a charge node QP in advance. In an exemplary embodiment, the precharge part 10 may receive the carry signal before receiving the clock signal CKV through the first clock terminal CK1. In one exemplary embodiment, for example, the i-th stage may receive the (i−1)-th carry signal CRi−1 through the first input terminal IN1.

The precharge part 10 includes a first transistor TR1 and is electrically connected to the first input terminal IN1. The first transistor TR1 includes a gate electrode and a first electrode, which are connected to the first input terminal IN1, and a second electrode connected to the charge node QP. The voltage level of the charge node QP may increase in response to the carry signal provided through the first input terminal IN1. As a result, a capacitor C of the output part 30 may be charged with a voltage.

The charge part 20 may charge the charge node QP with the voltage based on the voltage provided from the first clock terminal CK1. Since the charge part 20 increases the voltage level of the charge node QP, a gate signal Gi may be output from the output part 30.

The charge part 20 includes a second transistor TR2 and a third transistor TR3. The second transistor TR2 includes a gate electrode connected to the charge node QP, a first electrode connected to the first clock terminal CK1, and a second electrode connected to a carry terminal CR from which a carry signal CRi of the i-th stage SRCi is output. The third transistor TR3 includes a gate electrode connected to the first clock terminal CK1, a first electrode connected to the charge node QP, and a second electrode connected to a carry output terminal.

The second transistor TR2 provides the clock signal CKV at the high voltage, which is received through the first clock terminal CK1, to the third transistor TR3 in response to the voltage level of the charge node QP. The third transistor TR3 provides the clock signal CKV at the high voltage, which is provided from the second transistor TR2, to the charge node QP in response to the clock signal CKV at the high voltage. As a result, the voltage level of the charge node QP may increase.

The output part 30 may apply the clock signal CKV at the high voltage to an output node OP in response to the voltage level of the charge node QP. The output part 30 includes a fourth transistor TR4, and the fourth transistor TR4 includes a gate electrode connected to the charge node QP, a first electrode connected to the first clock terminal CK1, and a second electrode connected to the output node OP. The output node OP is electrically connected to the output terminal OUT.

According to an exemplary embodiment, the voltage level of the charge node QP may be boosted by the high voltage of the clock signal CKV provided through the third transistor TR3 and the voltage charged in the capacitor C. The boosted voltage level of the charge node QP may be applied to the gate electrode of the fourth transistor TR4. The fourth transistor TR4 outputs the gate signal Gi corresponding to the high voltage of the clock signal CKV to the output terminal OUT through the output node OP.

Then, when the voltage level of the clock signal CKV is changed from the high voltage to the low voltage, the first discharge part 40 and the second discharge part 50 may decrease the voltage level of the charge node QP and the output node OP.

The first discharge part 40 includes first second, and third discharge transistors TR5, TR6 and TR7. The first discharge transistor TR5 includes a gate electrode connected to the second clock terminal CK2, a first electrode connected to the output node OP, and a second electrode connected to the first discharge terminal V1. The first discharge transistor TR5 is turned on in response to the high voltage of the clock bar signal CKVB provided through the second clock terminal CK2. When the first discharge transistor TR5 is turned on, the voltage level of the output node OP decreases to the first off voltage VSS1.

The second discharge transistor TR6 includes a gate electrode connected to the second input terminal IN2, a first electrode connected to the output node OP, and a second electrode connected to the first discharge terminal V1. The second discharge transistor TR6 is turned on in response to a carry signal CRi+6 output from the (i+6)-th stage. When the second discharge transistor TR6 is turned on, the voltage level of the output node OP decreases to the first off voltage VSS1.

The third discharge transistor TR7 includes a gate electrode connected to the second clock terminal CK2, a first electrode connected to the carry terminal CR, and a second electrode connected to the second discharge terminal V2. The third discharge transistor TR7 is turned on in response to the high voltage of the clock bar signal CKVB provided through the second clock terminal CK2. When the third discharge transistor TR7 is turned on, the voltage level of the carry terminal CR decreases to the second off voltage VSS2. In a case where the voltage level of the clock bar signal CKVB is changed to the high voltage from the low voltage, the voltage level of the clock signal CKV is changed to the low voltage from the high voltage.

The second discharge part 50 includes a discharge transistor TR8. The discharge transistor TR8 includes a gate electrode connected to the third input terminal IN3, a first electrode connected to the charge node QP, and a second electrode connected to the second discharge terminal V2. The discharge transistor TR8 is turned on in response to a carry signal CRi+10 output from the (i+10)-th stage. When the discharge transistor TR8 is turned on, the voltage level of the charge node QP decreases to the second off voltage VSS2.

In an exemplary embodiment, as described above, the first discharge part 40 and the second discharge part 50 may decrease the voltage level of the charge node QP, the output node OP and the carry terminal CR to the first off voltage VSS1 or the second off voltage VSS2 after the gate signal Gi is output. The first off voltage VSS1 or the second off voltage VSS2 may be a ground voltage.

According to an exemplary embodiment of the disclosure, the second off voltage VSS2 may have a first level lower than the first off voltage VSS1 or a second level lower than the first level. In such an embodiment, the second off voltage VSS2, the low voltage of the clock signal CKV and the low voltage of the clock bar signal CKVB may have a same value as each other. In one exemplary embodiment, for example, where the voltage level of the clock signal CKV is changed to the low voltage from the high voltage, the low voltage of the clock signal CKV may correspond to the second off voltage VSS2.

In an exemplary embodiment, as described with reference to FIG. 6, the first clock terminal CK1 connected to the output part 30 and the first discharge terminal V1 connected to the first discharge part 40 are electrically connected to each other.

If the voltage level of the first off voltage VSS1 is different from the voltage level of the second off voltage VSS2, a current may be flowed to the first clock terminal CK1 from the first discharge terminal V1. In this case, the low level of the clock signal CKV is the second off voltage VSS2, and the second off voltage VSS2 is lower than the first off voltage VSS1. As the voltage difference between the first off voltage VSS1 and the second off voltage VSS2 increases, a consumption of the current flowing to the first clock terminal CK1 from the first discharge terminal V1 increases.

In an exemplary embodiment, the voltage level of the second off voltage VSS2 is controlled based on the grayscale difference between the images, and thus the voltage difference between the first off voltage VSS1 and the second off voltage VSS2 may decrease. As a result, an overall power consumption of the display device DD may be reduced.

Figure 7:
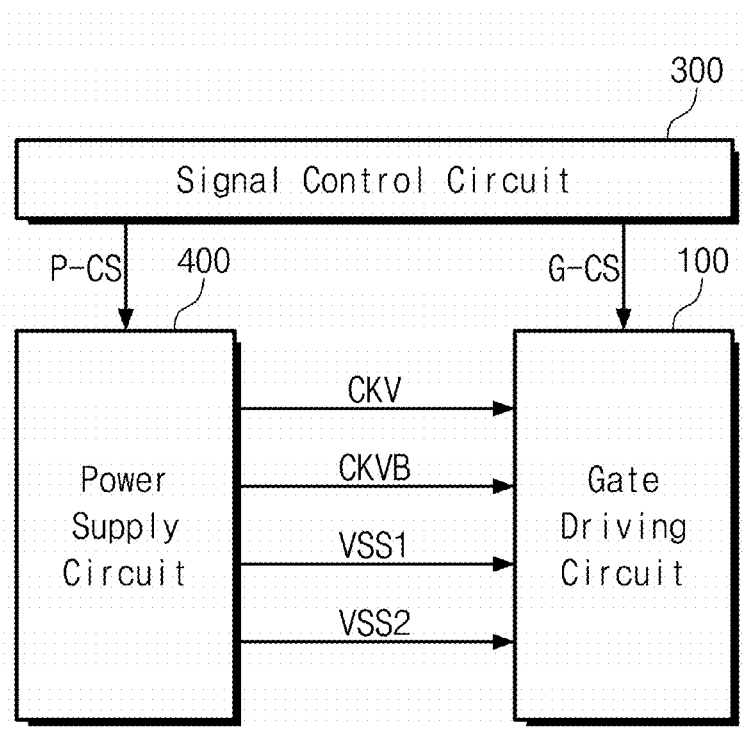
FIG. 7 is a block diagram showing a display device according to an exemplary embodiment of the disclosure.

FIG. 7 is a block diagram showing the display device according to an exemplary embodiment of the disclosure, FIG. 8A is a block diagram showing the signal control circuit shown in FIG. 7 according to an exemplary embodiment of the disclosure, and FIG. 8B is a table showing an operation of an image analyzing unit shown in FIG. 8A Referring to FIG. 7, an exemplary embodiment of the display device DD (shown in FIG. 1) further includes a power supply circuit 400 in addition to the gate driving circuit 100 and the signal control circuit 300.

In such an embodiment, the signal control circuit 300 outputs the gate control signal G-CS to the gate driving circuit 100. The gate control signal G-CS may include the vertical start signal STV (shown in FIG. 4) that starts the operation of the gate driving circuit 100. In such an embodiment, the signal control circuit 300 outputs a power control signal P-CS to the power supply circuit 400. The power control signal P-CS may be a control signal to determine the voltage level of the second off voltage VSS2.

In an exemplary embodiment, referring to FIG. 8A, the signal control circuit 300 includes an image analyzing unit 310 and a storage unit 320. The image analyzing unit 310 receives image signals corresponding to a plurality of frames. Hereinafter, an exemplary embodiment where a reception of first and second image signals IS1 and IS2 of two consecutive frames among the frames will be described with reference to FIG. 8A. The image based on the first image signal IS1 is displayed through the display panel DP (shown in FIG. 1) in the first frame of the two consecutive frames, and the image based on the second image signal IS2 is displayed through the display panel DP in the second frame of the two consecutive frames. The second frame may be a frame following the first frame.

The image analyzing unit 310 compares a first grayscale of the first image signal IS1 with a second grayscale of the second image signal IS2 and outputs the power control signal P-CS based on a result of the comparison of the first grayscale with the second grayscale. In an exemplary embodiment, as described above, the power control signal P-CS may be the control signal to control the level of the second off voltage VSS2 output from the power supply circuit 400. The second off voltage VSS2 may be set to one of the first level lower than the first off voltage VSS1 and the second level lower than the first level based on the power control signal P-CS.

The storage unit 320 may include information about the power control signal P-CS corresponding to a difference between the first grayscale of the first image signal IS1 and the second grayscale of the second image signal IS2. In an exemplary embodiment, the storage unit 320 may include information of a level value of the second off voltage VSS2 in accordance with the grayscale difference. The image analyzing unit 310 may generate the power control signal P-CS based on the information included in the storage unit 320.

Hereinafter, an exemplary embodiment of a method of generating the power control signal P-CS according to the difference between the first grayscale of the first image signal IS1 and the second grayscale of the second image signal IS2 will be described with reference to FIG. 8B.

In one exemplary embodiment, for example, when the grayscale difference GY between the first grayscale and the second grayscale is equal to or greater than a first difference D1, the image analyzing unit 310 outputs a first power control signal PS1 that controls the second off voltage VSS2 to have the second level.

In such an embodiment, when the grayscale difference GY between the first grayscale and the second grayscale is in a range between the first difference D1 and a second difference D2, the image analyzing unit 310 outputs a second power control signal PS2 that controls the second off voltage VSS2 to have the first level.

In such an embodiment, when the grayscale difference GY between the first grayscale and the second grayscale is equal to or smaller than the second difference D2, the image analyzing unit 310 outputs a third power control signal PS3 that controls the second off voltage VSS2 to be the level of the first off voltage VSS1. When the grayscale difference GY between the first grayscale and the second grayscale is equal to or smaller than the second difference D2, the grayscale of the first image signal IS1 and the grayscale of the second image signal IS2 may be the same as each other.

Figures 9A, 9B:
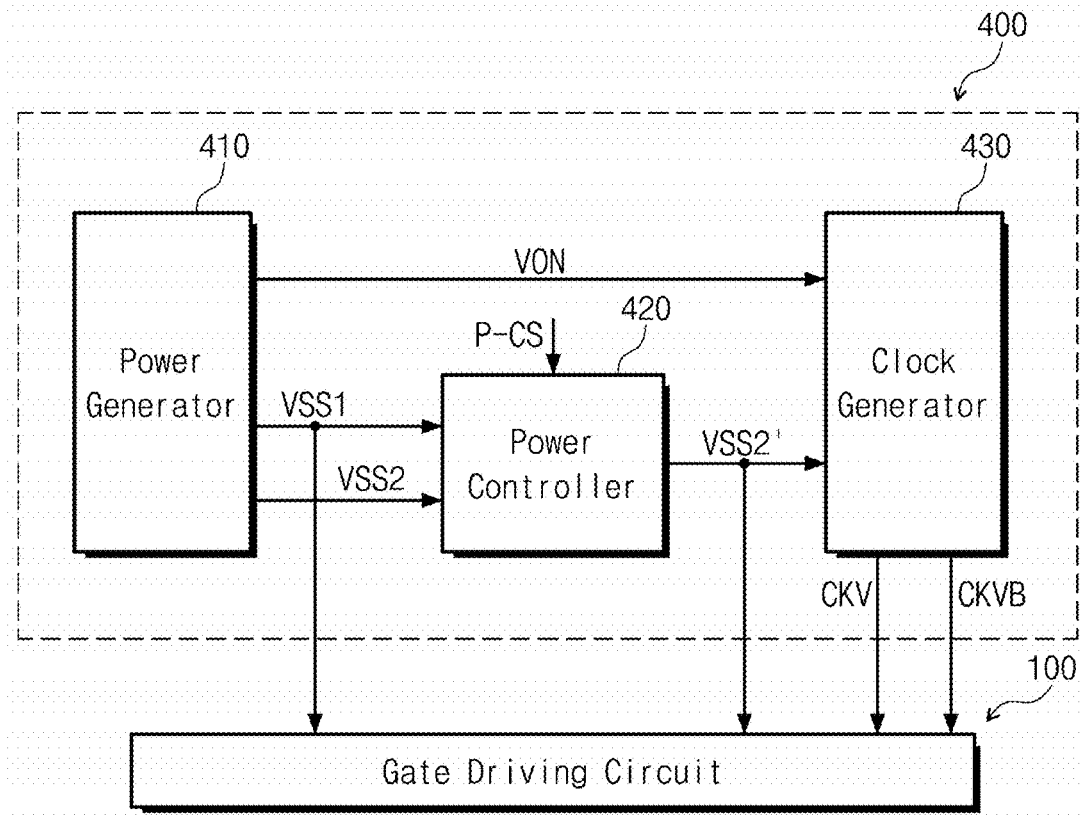
FIG. 9A is a block diagram showing a power supply circuit shown in FIG. 7 according to an exemplary embodiment of the disclosure.
FIG. 9B is a table showing an operation of a power supply circuit shown in FIG. 9A.
Figure 10A:
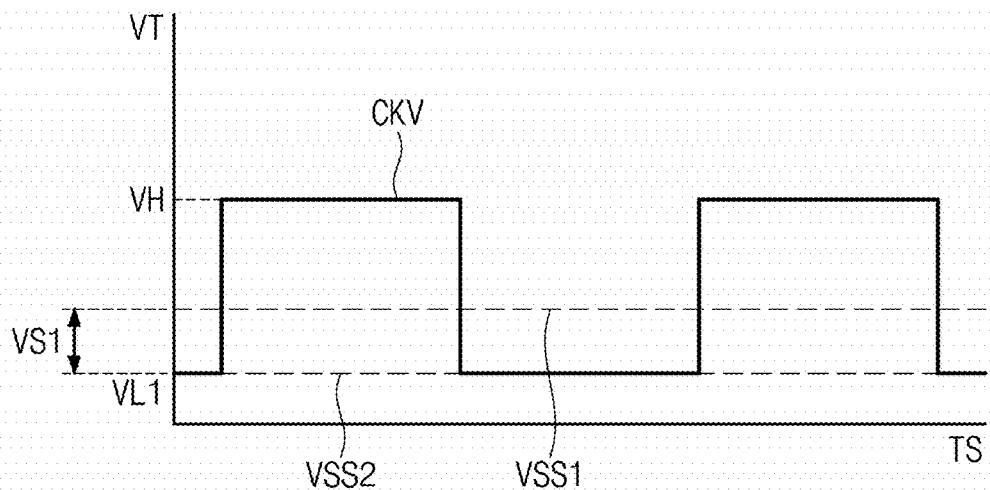
FIG. 10A is a timing diagram showing a clock signal according to an exemplary embodiment of the disclosure.
Figure 10B:
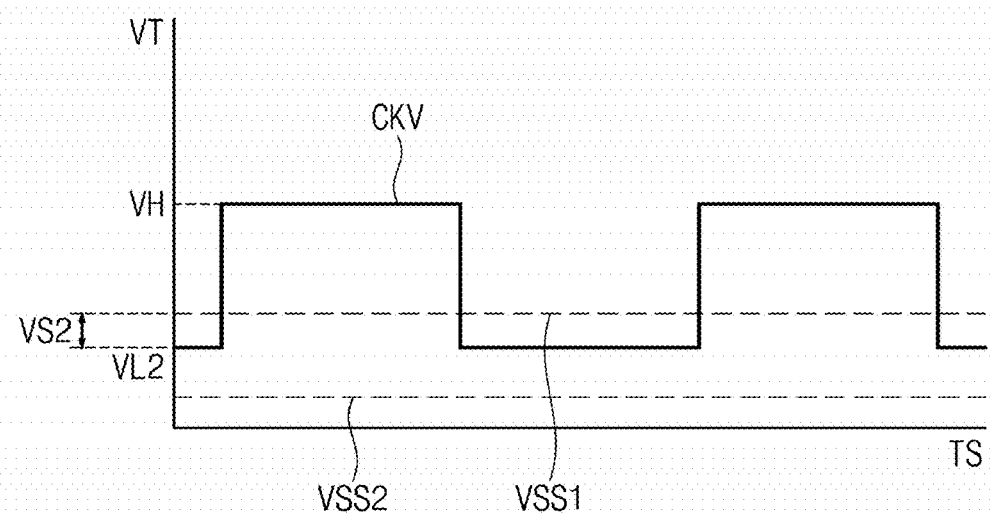
FIG. 10B is a timing diagram showing a clock signal according to an exemplary embodiment of the disclosure.
Figure 10C:
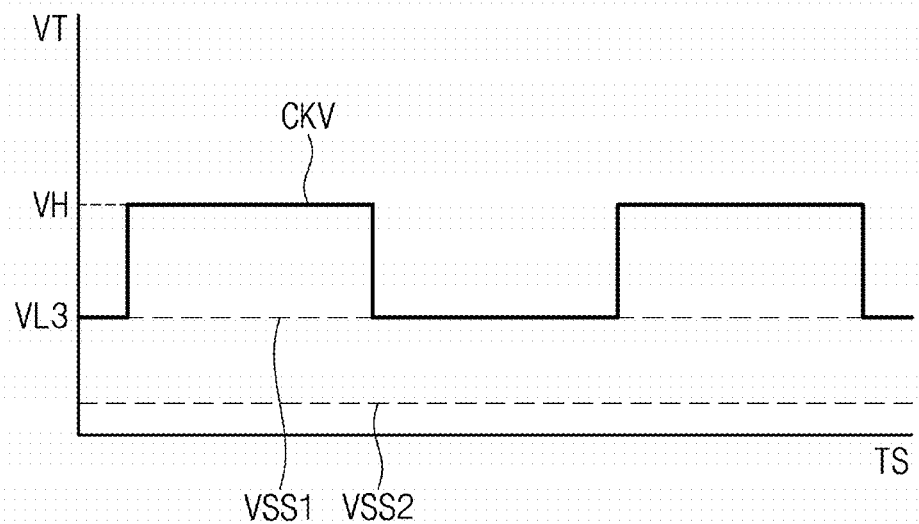
FIG. 10C is a timing diagram showing a clock signal according to an exemplary embodiment of the disclosure.

FIG. 9A is a block diagram showing the power supply circuit 400 shown in FIG. 7 according to an exemplary embodiment of the disclosure. FIG. 9B is a table showing an operation of the power supply circuit 400 shown in FIG. 9A. FIG. 10A is a timing diagram showing a clock signal according to an exemplary embodiment of the disclosure. FIG. 10B is a timing diagram showing a clock signal according to an exemplary embodiment of the disclosure. FIG. 10C is a timing diagram showing a clock signal according to an exemplary embodiment of the disclosure.

Referring to FIG. 9A, an exemplary embodiment of the power supply circuit 400 includes a power generator 410, a power controller 420, and a clock generator 430. The power supply circuit 400 may output a power signal to the gate driving circuit 100. The power signal may include the first off voltage VSS1, a second off voltage VSS2', the clock signal CKV and the clock bar signal CKVB. Although not shown in figures, the power supply circuit 400 may output the power signal to the display panel DP and other components. In one exemplary embodiment, for example, the common electrode CE (shown in FIG. 2) included in the display panel DP may receive the common voltage from the power supply circuit 400.

In an exemplary embodiment, the power generator 410 outputs a gate-on voltage VON, the first off voltage VSS1, and the second off voltage VSS2. The power generator 410 outputs the gate-on voltage VON to the clock generator 430 and outputs the first off voltage VSS1 to the power controller 420 and the gate driving circuit 100. In such an embodiment, the power generator 410 outputs the second off voltage VSS2 to the power controller 420.

The power controller 420 generates the second off voltage VSS2' based on the first off voltage VSS1 and the second off voltage VSS2, which are provided from the power generator 410. The power controller 420 outputs the second off voltage VSS2' to the gate driving circuit 100 and the clock generator 430.

Referring to FIG. 9B, the power controller 420 may control a level of the second off voltage VSS2' in response to the power control signal P-CS.

In an exemplary embodiment, when the power control signal P-CS corresponds to the first power control signal PS1, the power controller 420 sets the second off voltage VSS2' to have a first level VL1.

In FIG. 10A, a horizontal axis indicates a time TS, and a vertical axis indicates a voltage level VT. In FIG. 10A, the high voltage VH of the clock signal CKV may correspond to the gate-on voltage VON, and the first level VL1 of the second off voltage VSS2' may be substantially the same as the second off voltage VSS2 output from the power generator 410. Here, the first level VL1 of the second off voltage VSS2' may correspond to the low level of the clock signal CKV. The first off voltage VSS1 and the second off voltage VSS2' may have a first voltage difference VS1.

In an exemplary embodiment, when the power control signal P-CS corresponds to the second power control signal PS2, the power controller 420 sets the second off voltage VSS2' to have a second level VL2.

In such an embodiment, as shown in FIG. 10B, when the power control signal P-CS corresponds to the second power control signal PS2, the high voltage VH of the clock signal CKV may correspond to the gate-on voltage VON, and the second level VL2 of the second off voltage VSS2' may be different from the second off voltage VSS2 output from the power generator 410. The second level VL2 may have a level between the first off voltage VSS1 and the second off voltage VSS2. The first off voltage VSS1 and the second off voltage VSS2' may have a second voltage difference VS2. The second voltage difference VS2 may be smaller than the first voltage difference VS1.

Accordingly, the difference in level between the first off voltage VSS1 and the second off voltage VSS2' may be reduced more when the second off voltage VSS2' is set to have the second level VL2 than when the second off voltage VSS2' is set to have the first level VL1. Therefore, the power generated by the power supply circuit 400 is reduced, and thus the overall power consumption of the display device DD may be reduced.

In an exemplary embodiment, when the power control signal P-CS corresponds to the third power control signal PS3, the power controller 420 sets the second off voltage VSS2' to have a third level VL3.

In such an embodiment, as shown in FIG. 10C, when the power control signal P-CS corresponds to the third power control signal PS3, the high voltage VH of the clock signal CKV may correspond to the gate-on voltage VON, and the third level VL3 of the second off voltage VSS2' may be different from the second off voltage VSS2 output from the power generator 410. The third level VL3 may be set to substantially the same level as the first off voltage VSS1.

Accordingly, the difference in level between the first off voltage VSS1 and the second off voltage VSS2' may be reduced more when the second off voltage VSS2' is set to have the third level VL3 than when the second off voltage VSS2' is set to have the first level VL1 or the second level VL2. Therefore, the power generated by the power supply circuit 400 is reduced, and thus the overall power consumption of the display device DD may be reduced.

Referring back to FIG. 9A, in an exemplary embodiment, the clock generator 430 may generate the clock signal CKV and the clock bar signal CKVB based on the gate-on voltage VON and the second off voltage VSS2'. In such an embodiment, the clock generator 430 generates the clock signal CKV and the clock bar signal CKVB in accordance with the high voltage corresponding to the gate-on voltage VON and the low voltage corresponding to the second off voltage VSS2'. The clock generator 430 applies the generated clock signal CKV and clock bar signal CKVB to the gate driving circuit 100.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
    a display panel;
    a gate driving circuit comprising a plurality of stages which outputs a plurality of gate signals to the display panel based on a power signal;
    a power supply circuit which generates the power signal based on a power control signal; and
    a signal control circuit which outputs the power control signal,
    wherein an i-th stage among the stages comprises:
        a charge part which charges a charge node with a clock signal having a first high voltage for a first period;
        an output part connected to the charge part through the charge node, wherein the output part charges an output node with the first high voltage of the clock signal in response to a first voltage of the charge node for the first period, and outputs a second voltage of the output node as an i-th gate signal among the gate signals;
        a first discharge part connected to the output part through the output node, wherein the first discharge part discharges the second voltage to a first off voltage in response to a clock bar signal having a second high voltage for a second period following the first period; and
        a second discharge part connected to the charge node, wherein the second discharge part discharges the first voltage to a second off voltage for the second period,
    wherein the second off voltage has one of a first level and a second level,
    wherein the first level is lower than a level of the first off voltage, and the second level is lower than the first level,
    wherein i is a natural number,
    wherein the clock signal swings between the first high voltage and a first low voltage during a frame,
    wherein the clock bar signal swings between the second high voltage and a second low voltage during the frame,
    wherein each of the first low voltage and the second low voltage has the one of the first level and the second level during the frame, and
    wherein the signal control circuit outputs the power control signal to set the second off voltage to have the second level when the grayscale difference between a first frame and a second frame is equal to or greater than a first difference.

2. The display device of claim 1, wherein the signal control circuit comprises an image analyzing unit which outputs the power control signal based on a grayscale difference between a first grayscale with respect to an image of the first frame and a second grayscale with respect to an image of the second frame following the first frame.

3. The display device of claim 2, wherein the image analyzing unit outputs the power control signal to set the second off voltage to have the second level when the grayscale difference between the first grayscale and the second grayscale is equal to or greater than the first difference.

4. The display device of claim 2, wherein the image analyzing unit outputs the power control signal to set the second off voltage to have the first level when the grayscale difference between the first grayscale and the second grayscale is equal to or smaller than the first difference.

5. The display device of claim 1, wherein the power supply circuit comprises:
    a power generator which outputs a gate-on voltage, the first off voltage, and the second off voltage having the second level;
    a power controller which outputs the second off voltage at the first level or at the second level in response to the power control signal; and
    a clock generator which generates the clock signal and the clock bar signal based on the gate-on voltage and the second off voltage output from the power controller.

6. The display device of claim 5, wherein
    the clock bar signal has the second low voltage for the first period,
    the clock signal has the first low voltage for the second period, and
    the clock generator sets the first low voltage and the second low voltage to have a same level as the second off voltage.

7. The display device of claim 5, wherein the power signal comprises the clock signal, the clock bar signal, the first off voltage, and the second off voltage.

8. The display device of claim 1, wherein the first level is between the level of the first off voltage and the second level.

9. The display device of claim 1, wherein a first clock terminal connected to the output part is electrically connected to a first discharge terminal connected to the first discharge part through the output node.

10. The display device of claim 1, wherein the display panel comprises:
    a first substrate on which the gate driving circuit is disposed;
    a second substrate disposed opposite to the first substrate; and
    a liquid crystal layer disposed between the first substrate and the second substrate.

* * * * *